United States Patent
Babonneau et al.

(10) Patent No.: US 6,724,465 B2
(45) Date of Patent: Apr. 20, 2004

(54) LITHOGRAPHY DEVICE WHICH USES A SOURCE OF RADIATION IN THE EXTREME ULTRAVIOLET RANGE AND MULTI-LAYERED MIRRORS WITH A BROAD SPECTRAL BAND IN THIS RANGE

(75) Inventors: Danièle Babonneau, Morsang/Orge (FR); Rémy Marmoret, Levis St Nom (FR); Laurence Bonnet, Linas (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/130,519

(22) PCT Filed: Dec. 7, 2000

(86) PCT No.: PCT/FR00/03429

§ 371 (c)(1),
(2), (4) Date: May 20, 2002

(87) PCT Pub. No.: WO01/42855

PCT Pub. Date: Jun. 14, 2001

(65) Prior Publication Data

US 2002/0171817 A1 Nov. 21, 2002

(30) Foreign Application Priority Data

Dec. 8, 1999 (FR) .............................................. 99 15470

(51) Int. Cl.[7] .......................... G03B 27/54; G03B 27/42
(52) U.S. Cl. .......................................... 355/67; 355/53
(58) Field of Search ............................. 355/30, 52, 53, 355/55, 67–71; 356/399–401; 250/548, 492.2

(56) References Cited

U.S. PATENT DOCUMENTS 4,684,565 A * 8/1987 Abeles et al. ............... 428/220
5,305,364 A * 4/1994 Mochiji et al. ............... 378/34
5,310,603 A * 5/1994 Fukuda et al. ............... 428/446

FOREIGN PATENT DOCUMENTS

WO      WO 96 04665      2/1996

OTHER PUBLICATIONS

D.G. Stearns, R.S. Rosen, and S.P. Vernon, "Multilayer Mirror Technology For Soft–X–Ray Projection Lithography", Dec. 1, 1993, pp. 6952–6960.

Romuald Bobkowski, Robert Fedosejevs and James N. Broughton, "Development of a .01 Micron Linewidth Fabrication Process for X–Ray Lithography with a Laser. plasma Source", Mar. 1999, pp. 392–398.

H. Hirose, K. Ando and Y. Aoyagi, "Novel X–Ray Source Using RearSide X–Ray Emission from the Foil Target", 1996, pp. 277–280.

* cited by examiner

Primary Examiner—Henry Hung Nguyen
(74) Attorney, Agent, or Firm—Pearne & Gordon LLP

(57) ABSTRACT

Lithography device using a source of radiation in the extreme ultraviolet range and multi-layered mirrors with a broad spectral band within this range.

Each mirror (24, 26, 29) includes a stack of layers of a first material and layers of a second material alternating with the first material. The first material has an atomic number greater than that of the second material. The thickness of pairs of adjacent layers is a monotonic function of the depth in the stack. The source (22) comprises at least one target (28) which emits the radiation by interAction with a laser beam focused on one of its faces. A part (36) of the radiation emitted from the other face is used. The invention is applicable to the manufacture of integrated circuits with a high degree of integration.

19 Claims, 8 Drawing Sheets

LITHOGRAPHY DEVICE WHICH USES A SOURCE OF RADIATION IN THE EXTREME ULTRAVIOLET RANGE AND MULTI-LAYERED MIRRORS WITH A BROAD SPECTRAL BAND IN THIS RANGE

TECHNOLOGICAL FIELD

This invention relates to a lithography device using a source of extreme ultraviolet radiation and multi-layered mirrors provided to reflect this extreme ultraviolet radiation that is also called "EUV radiation" or "X-UV radiation".

The wavelength of such radiation is within the range extending from 8 nm to 25 nm.

The invention is applicable most particularly to the manufacture of integrated circuits with a very high degree of integration, the use of EUV radiation enabling one to reduce the etch spacing of such circuits.

STATE OF THE PRIOR ART

In the main, two techniques are known for producing intense EUV radiation. Both of them rely on the collection of photons produced by the microscopic process of spontaneous emission by a hot plasma of low density which is generated by means of a laser.

The first technique uses a jet of xenon irradiated by a YAG laser, the power of which is close to 1 kW. In effect, when the nature of the gas and the conditions for expansion into the vacuum are well chosen, clusters are naturally created in the jet through multi-body interactions. These clusters are macro-particles which can contain up to a million atoms and have a density which is sufficiently high (about one tenth of the density of the solid) to absorb the laser beam and thereby heat the atoms of the surrounding gas which can then emit photons through fluorescence.

The second technique uses the corona of a plasma of high atomic number, obtained by interaction of a laser beam, which comes from a KrF laser, the intensity of which is close to $10^{12}$ W/cm$^2$, and a solid target of great thickness (at least 20 μm).

The laser beam is focused on one face of this target, called the "front face" and one uses the EUV radiation emitted by this front face and generated by interaction of the laser beam and the material of the target.

If the first or the second technique is used, the EUV radiation obtained comprises a continuous energy spectrum and with strong emission lines.

The UEV radiation sources which the first and second techniques use have the following disadvantages.

These sources have an isotropic emission which therefore has a large angular divergence, and the emitted EUV radiation spectrum includes lines of low spectral width.

It is then necessary to associate with each source, complicated optical collection means which enable one to recover the maximum from the wide angular field of emission from the source.

These optical means formed by multi-layered mirrors, must be produced in such a way that their spectral responses are centered on the emission line chosen for the exposure of a sample, restricting as much as possible the loss of intensity due to multiple reflections on the multi-layered mirrors.

A known example of a lithography device using EUV radiation, the wavelengths of which are situated, for example, close to the range from 10 nm to 14 nm is diagrammatically shown in FIGS. 1 and 2. Such a device is also called an "EUV lithography device".

This known device is intended to expose a sample E. Generally, this is a semi-conductor substrate 2 (for example made of silicon) onto which a layer of photosensitive resin ("a photo-resist layer") 3 has been deposited and it is desired to expose this layer in accordance with a specified pattern.

After exposure of the layer 3, it is developed and the substrate 2 can then be etched in accordance with the pattern.

The device in FIGS. 1 and 2 includes
a support 4 for the sample,
a mask 5 comprising the specified pattern in an enlarged form
a source 6 of radiation in the extreme ultraviolet range (FIG. 2),
optical means 7 for the collection and the transmission of the radiation to the mask 5, the latter providing an image of the pattern in enlarged form, and
optical means 8 for reducing this image and projecting the reduced image onto the layer 3 of photosensitive resin (chosen in such a fashion that it is sensitive to the incident radiation).

The known source 6 of EUV radiation comprises means of forming a jet J of clusters of xenon. Only the nozzle 9 which includes these formation means is represented in FIG. 2.

The source also comprises a laser (not shown), the beam of which F is focused onto a point S of the jet J by the optical means of focusing 10. The interaction of this beam F and the xenon clusters generate the EUV radiation R.

The point S is visible in FIG. 1 (but not the nozzle nor the jet of xenon clusters).

Among the optical means 7 of the device for collection and transmission, there is an optical collector 11 provided with a central opening 12 to allow the focused laser beam F to pass.

This optical collector 11 is positioned facing the jet of xenon clusters and is intended to collect a part of the EUV radiation emitted by the xenon clusters and to transmit this collected radiation 13 toward other optical components that also form a part of the optical means 7 for collection and for transmission.

These optical means 7 for collection and for transmission, the mask 5, which is used in reflection, and the optical means 8 for reduction and for projection are multi-layered mirrors 14 which selectively reflect the EUV radiation and are designed in such a way that their spectral responses are centered on the wavelength chosen for exposure of the layer of photosensitive resin 3.

It should be made clear that the pattern, in accordance with which one wishes to etch the sample, is formed on the multi-layered mirror corresponding to the mask 5, with an enlargement factor suited to the optical means for reduction and for projection, and this multi-layered mirror is coated, except for the pattern, with a layer (not shown) which is capable of absorbing the incident EUV radiation.

Within the wavelength range of EUV radiation, the spectral resolution $\Delta\lambda/\lambda$ of the mirrors is about 4%.

The breadth of the spectral range usable for exposure is obtained by the convolution of the spectral breadth of the EUV radiation and this spectral resolution.

The known multi-layered mirrors to which we will return subsequently and which are used in the lithography device shown in FIGS. 1 and 2, have, in particular, the following disadvantage: their spectral band, which is centered on the wavelength chosen for the exposure, is narrow.

The result is a reduction in the efficiency of the lithography device.

These EUV multi-layered mirrors also have the disadvantage of deforming when they are exposed to a high thermal flux coming from the source of EUV radiation for the device.

DESCRIPTION OF THE INVENTION

One aim of the invention is to propose an EUV lithography device that is much more efficient than the known devices considered to be the most highly efficient.

The device which is the subject of the invention comprises a source of EUV radiation which is anisotropic. This EUV radiation is emitted through the back face of a solid target of suitable thickness on the front face of which a laser beam is focused.

Such an anisotropic source enables one to increase the effective portion of the EUV radiation beam and to simplify the collection of this radiation.

Furthermore, the device which is the subject of the invention comprises multi-layered mirrors capable of reflecting the generated EUV radiation, each layered mirror having a spectral band (also called "spectral width" or "bandwidth") greater than that of the known multi-layered mirrors mentioned above.

The source used in the invention, the emission spectrum of which is closer to black body over a broad spectral range, and the multi-layered mirrors with a broad spectral bandwidth, also used in the invention, work together to lead to a device capable of supplying the sample, which one wishes to expose with EUV radiation which is more intense than in the prior art.

Another aim of the invention is to minimize thermal deformation of the multi-layered mirrors which are used in the invention when these multi-layered mirrors are exposed to the intense flux of EUV radiation.

To put it precisely, the subject of this invention is a lithography device comprising:
- a support for a sample intended to be exposed in accordance with a specified pattern,
- a mask comprising the specified pattern in an enlarged form,
- a source of radiation in the extreme ultraviolet range,
- optical means for the collection and for the transmission of the radiation to the mask, the latter supplying an image of the pattern in enlarged form, and
- optical means for the reduction of this image and for the projection of the reduced image onto the sample, the mask, the optical means for collection and transmission and the optical means for reduction and projection comprising multi-layered mirrors, each multi-layered mirror comprising a substrate and, on this substrate, a stack of layers of a first material and of layers of a second material which alternate with the layers of the first material, this first material having an atomic number greater than that of the second material, the first and second layers co-operating to reflect the extreme ultraviolet radiation, the stack having a free surface onto which the radiation to be reflected arrives, this device being characterized in that the source comprises at least one solid target, having first and second faces, this target being capable of emitting, in an anisotropic way, a part of the extreme ultraviolet radiation from the second face of this target, in that the optical means for collection and for transmission are provided in order to transmit, to the mask, the part of the extreme ultraviolet radiation coming from the second face of the target of the source and in that the thickness of pairs of adjacent layers, in the stack of layers that each mirror comprises, is a monotonic function of the depth in the stack, this depth being counted from the free surface of the stack.

By a "monotonic function" one understands a function which is either increasing or decreasing.

According to a preferred embodiment of the device which is a subject of the invention, the target contains a material which is capable of emitting the extreme ultraviolet radiation by interaction with the laser beam and the thickness of the target is within a range extending from about 0.05 $\mu$m to about 5 $\mu$m.

Preferably, the target contains a material which is capable of emitting the extreme ultraviolet radiation through interaction with the laser beam and which has an atomic number belonging to the group of atomic numbers ranging from 28 to 92.

According to one particular embodiment of the device which is a subject of the invention, this device comprises a plurality of targets which are made integral one with another, the device additionally comprising means of displacing this plurality of targets so that these targets successively receive the laser beam.

The device may additionally comprise support means to which the targets are fixed and which are capable of allowing the laser beam to pass in the direction of these targets, the means of displacement being provided in order to displace these means of support and hence the targets.

These means of support can be capable of absorbing radiation emitted by the first face of each target which receives the laser beam and of re-emitting this radiation towards this target.

According to a first particular embodiment of the device which is a subject of the invention, the means of support comprise an opening facing each target, this opening being defined by two sidewalls, substantially parallel to one another and perpendicular to this target.

According to a second particular embodiment, the means of support comprise an opening facing each target, this opening being defined by two sidewalls which become further apart from one another as they go towards the target.

According to a particular embodiment of the invention, the device additionally comprises auxiliary fixed means which are capable of allowing the laser beam to pass in the direction of the target, of absorbing the radiation emitted by the first face of this target and of re-emitting this radiation towards this target.

According to a preferred embodiment of the invention, the stack which each multi-layered mirror comprises, is subdivided into assemblies of at least one pair of first and second layers and the thickness of these assemblies is a monotonic function of the depth in the stack, this depth being counted from the free surface of the stack.

According to a particular embodiment of the invention, the increases in thickness of these assemblies form an arithmetic progression.

Preferably, the first and second layers of each assembly have approximately the same thickness.

By way of example, the first and second layers may be respectively molybdenum and beryllium or molybdenum and silicon.

The substrate may, for example, be made of silicon or germanium.

Preferably, the thickness of the substrate is within the range extending from about 5 mm to about 40 mm and the thickness of the stack is about 1 $\mu$m.

According to a preferred embodiment of the invention, each multi-layered mirror is fitted with means of cooling this multi-layered mirror in order to reduce its deformation when it is illuminated by the EUV radiation.

Preferably, these cooling means are provided in order to cool the mirror to a temperature roughly equal to 100 K.

For example the means of cooling the mirror are liquid helium, Freon, liquid nitrogen or a cooling fluid which is a heat transfer fluid at a low temperature close to 0 K.

The sample that it is desired to expose may comprise a semi-conductor substrate on which a layer of photo-sensitive resin is deposited and is intended to be exposed in accordance with the specified pattern.

BRIEF DESCRIPTION OF THE DRAWINGS

This invention will be better understood on reading the description of embodiment examples given below, for purely information purposes, being in no way limitative and which refer to the appended drawings in which.

DETAILED DESCRIPTION OF PARTICULAR EMBODIMENTS

Figure 1:
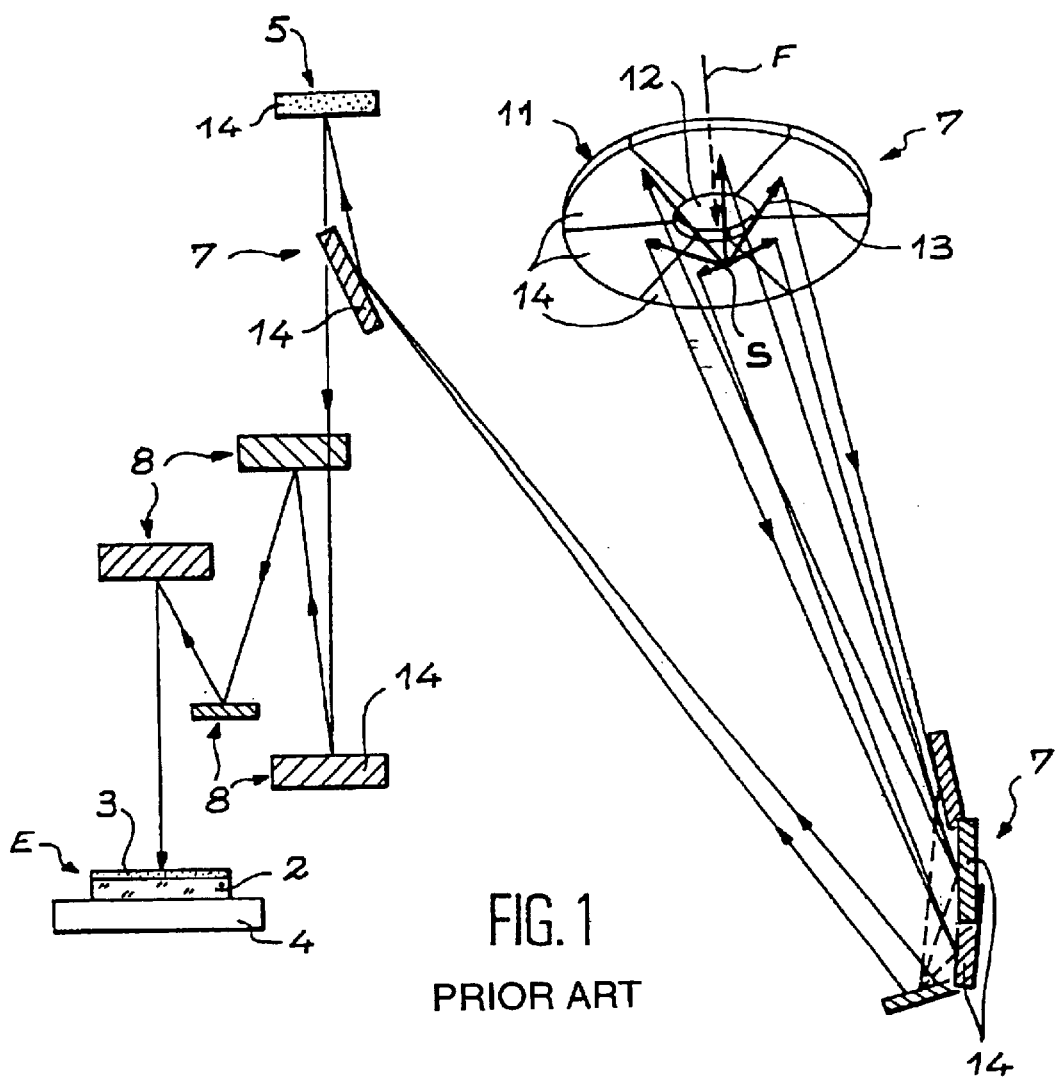
FIGS. 1 and 2 diagrammatically illustrate a known EUV lithography device and have already been described.
Figure 2:
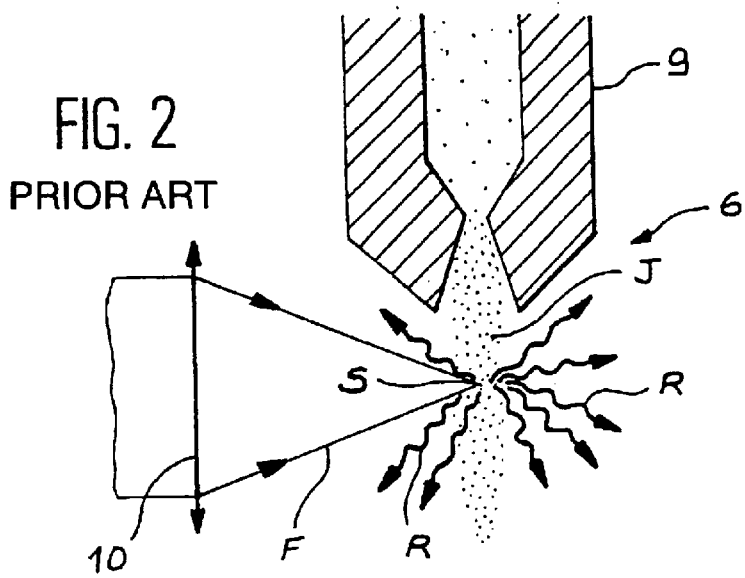

A plasma created by interaction of a solid target and a laser beam comprises several zones. There is of course the interaction zone that is called the corona but there are also, in a successive and simplified fashion:

a zone called the conduction zone where the laser beam does not penetrate, the development of which is controlled by thermal, electronic and radiation conduction, a part of the photons emitted by the ions from the corona being emitted in the direction of the cold and dense part of the target, and the absorption and re-emission zone where the photons with high energy, which arrive from the corona or from the conduction zone, are absorbed by the dense and cold material and thereby contribute to the heating of this material and therefore to the emission of photons of lower energy.

These photons form a radiation wave which has, in the medium, a favored direction of propagation, along the temperature gradient and which can, when the target is not too thick, leave the target through its back face, the face which is geometrically opposite to that where the laser has interacted. The efficiency of conversion in the back face (the ratio between the radiation energy, including all wavelengths, to the energy of the incident laser) can be close to 30%.

This emission from the back face of the target is characterized by a spectral distribution that is very different from that from the front face since the temperature and density conditions of the zones responsible for the emission of photons are very different. The radiation emitted has a natural angular distribution, even with a perfectly flat target: this radiation is not isotropic.

Furthermore, the characteristic speed of expansion from the back face is lower than that from the front face by several orders of magnitude, the majority of the energy being in the form of radiation.

Hence, in the present invention, EUV radiation is used which is emitted through the back face of a solid target of suitable thickness, on the front face of which the laser beam is focused. In this way, anisotropic radiation is obtained and material debris is reduced to a minimum.

To generate the EUV radiation, the target preferably contains a material whose atomic number Z is such that $28 \leq Z \leq 92$.

One can mix or associate with this material other materials that are also capable of generating EUV radiation having good spectral characteristics through interaction with the laser beam.

Apart from this, one or more other materials intended to filter parasitic radiation may also be associated with it.

The thickness of the target, containing the material generating the EUV radiation or active element, is preferably between 0.05 μm and 5 μm.

Preferably, the target is optimized in order to provide an efficient emission through the back face, without the expansion of the material being too great.

The laser characteristics (in particular the duration and the temporal shape of the light pulses that it supplies, the wavelength and the intensity) are also matched to obtaining the thermodynamic conditions required in the target in order to provide optimum EUV conversion in the back face within the desired range of wavelengths which extends, for example, from 10 nanometers to 20 nanometers.

Figure 3:
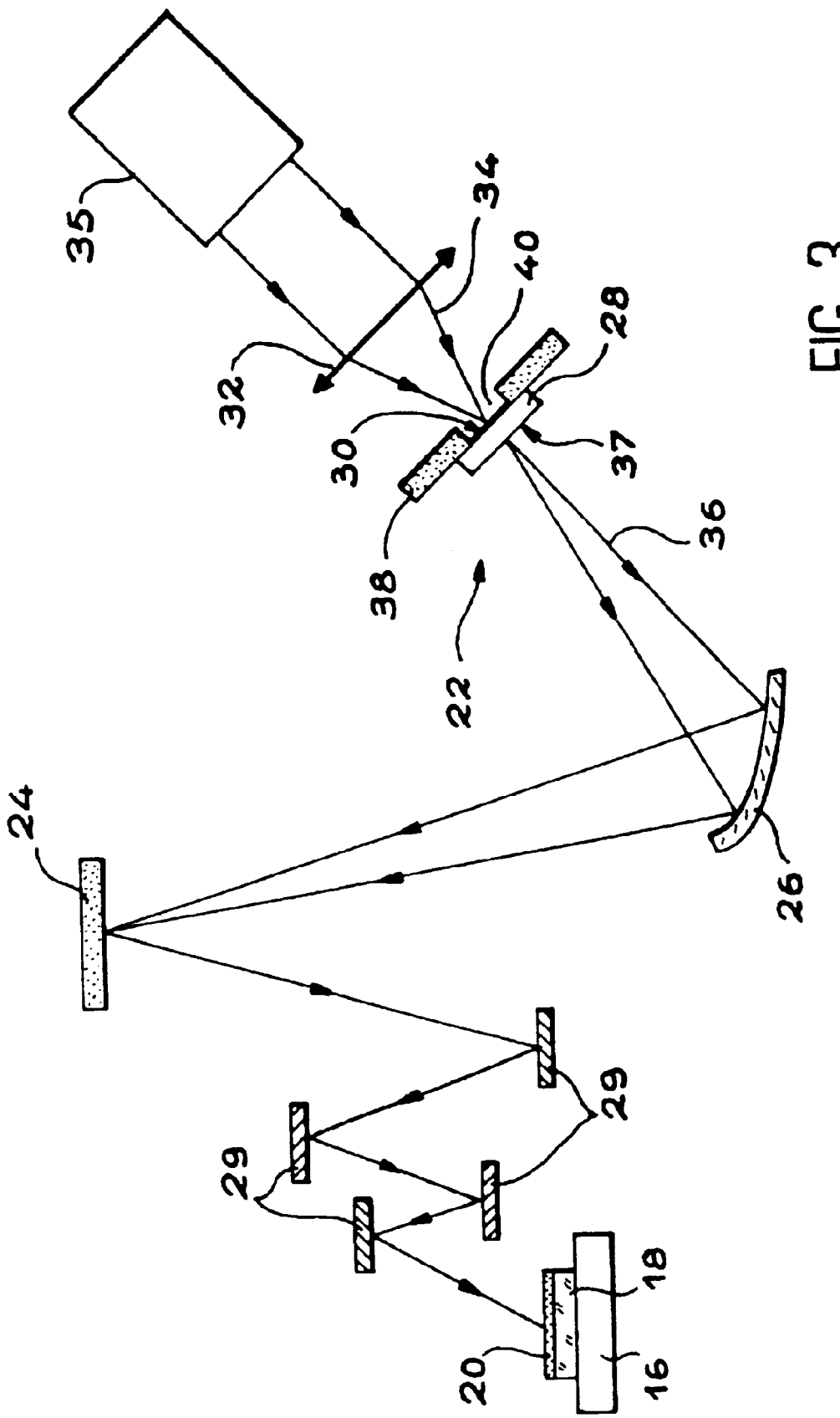
FIG. 3 is a diagrammatic view of a particular embodiment of the lithography device which is a subject of the invention.

A particular embodiment of the lithography device that is a subject of the invention is represented diagrammatically in FIG. 3.

This lithography device comprises a support 16 for a semiconductor substrate 18, for example, a silicon substrate, onto which a layer 20 of photo-sensitive resin is deposited, which is intended to be exposed in accordance with a specified pattern.

Apart from a source 22 of EUV radiation, the device comprises:

a mask 24, comprising the pattern in an enlarged form optical means 26 for the collection and for the transmission to the mask 24, of the part of the radiation supplied through the back face of the solid target 28 which the source comprises, the mask 24 supplying an image of this pattern in enlarged form, and optical means 29 for the reduction of this image and for the projection of the reduced image onto the layer 20 of photo-sensitive resin.

The target is, for example, made of a material such as silver, copper, tin, samarium or rhenium and has a small thickness (for example, of the order of 1 μm).

To generate the EUV radiation intended to be used to expose the layer of photo-sensitive resin, a pulsed beam 34 emitted by a pulsed laser 35 is focused on a first face 30 of the target, called the "front face", using optical focusing means 32. The target 28 then emits anisotropic EUV radiation 36 from its back face 37 which is opposite the front face 30.

It should be made clear that the source 22, the optical means 26 for collection and transmission, the collector 26, the mask 24, the optical means 29 and the support 16 carrying the substrate 20 are placed within an enclosure (not shown) where low pressure is established. The laser beam is sent into this enclosure through a suitable window (not shown).

In the example in FIG. 3, the optical means of collection 26 consist of an optical collector which is arranged facing the back face 37 of the target 28, provided to collect the EUV radiation emitted in anisotropic fashion through this back face, to shape this radiation and send it towards the mask 24.

In the device in FIG. 3, it is not therefore necessary to provide additional optical means between the collector 26 and the mask 34, which simplifies the optical means of the lithography device.

It may be seen that the target of small thickness 28 is fixed by its front face 30 to a support 38 provided with an opening 40 that allows the passage of the focused laser beam 34 so that it reaches this front face.

In practice, given that a laser pulse locally destroys the target of small thickness, it is not possible to send the laser beam twice to the same place on the target. This is why the support 38 is provided with displacement means (not shown in FIG. 3) that enable one to expose successively, different zones of the target to the focused laser beam.

Figure 4:
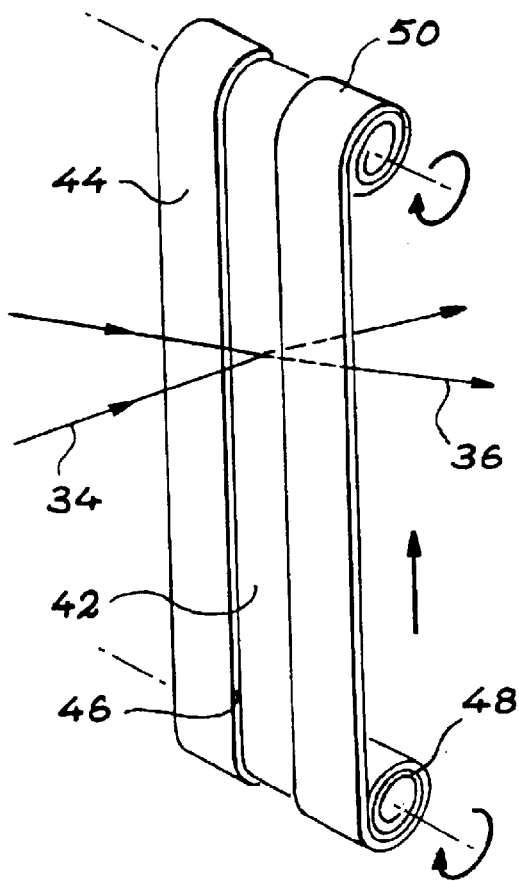
FIG. 4 is a diagrammatic perspective view of a strip forming an assembly of targets which can be used in the invention.

This is diagrammatically illustrated in FIG. 4 where one can see a solid target 42 of small thickness (for example 1 μm) in the form of a strip fixed to a flexible support 44 which is, for example made of a plastic material and is provided with a longitudinal opening 46 to permit passage of the focused beam 34.

The target-support assembly forms a composite flexible strip which is unwound from a first spool 48 and is wound onto a second spool 50 capable of being rotated by suitable means (not shown). This permits displacement of the target opposite the focused laser beam the pulses of which successively reach different zones of the target. This can then be considered as several targets assembled one to another.

In a variant (not shown) it is possible to use a flexible strip of plastic material as a target support and to fix several targets onto this support at regular intervals, an opening then being provided in the support opposite each target to allow passage of the focused laser beam.

Preferably, instead of a strip of plastic material, a strip 52 (FIG. 5) for example, of copper, silver, tin, samarium or rhenium is used, this strip being capable of absorbing the radiation emitted through the front face of the target 42 under the impact of the focused beam 34 and of re-emitting this radiation in the direction of this target (which is mobile with the strip 52). This strip 52 has, for example, a thickness of the order of from 5 μm to 10 μm.

Figure 5:
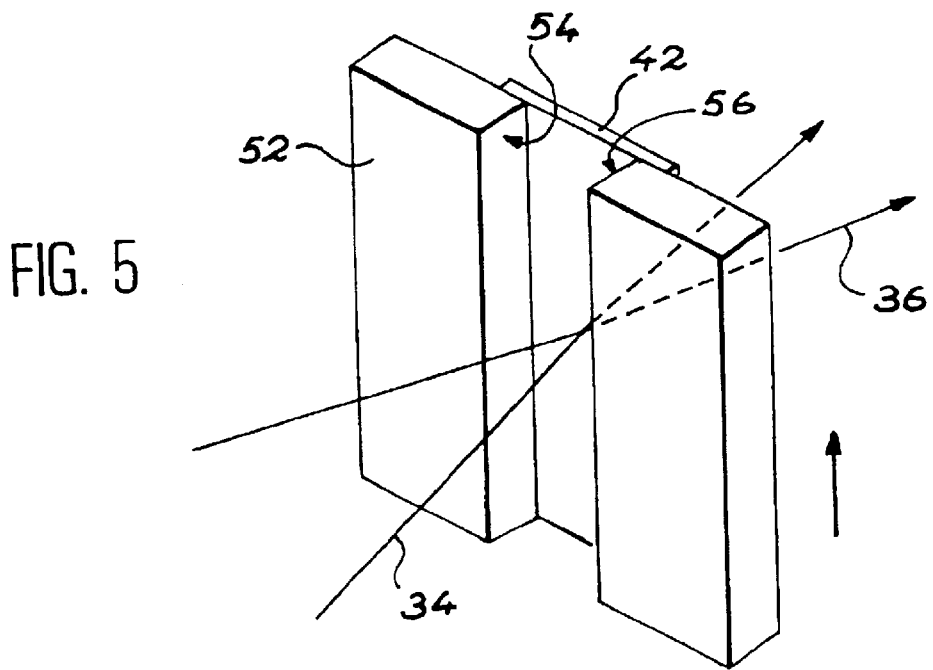
FIGS. 5 and 6 are diagrammatic and partial perspective views of sources of EUV radiation that can be used in the invention.

The longitudinal opening that permits passage of the laser beam 34 which is focused on the target can be defined by two sidewalls 54 and 56 approximately parallel to one another and substantially perpendicular to the target as can be seen in FIG. 5.

Figure 6:
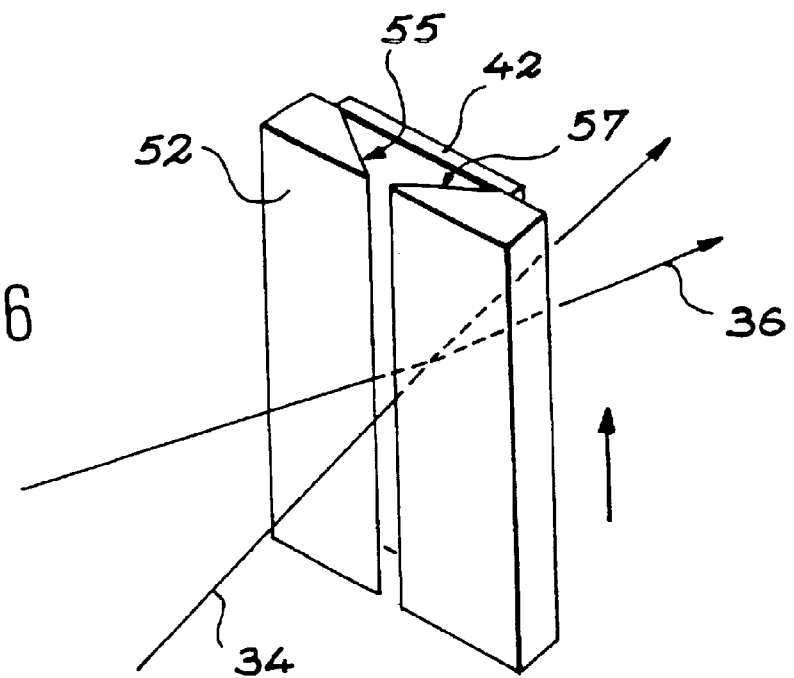

However, for better absorption of the radiation emitted through the front face of the target and better re-emission of this radiation towards the target, it is preferable that the two sidewalls defining the opening become further apart from one another as they go towards the target, as may be seen in FIG. 6 where the two sidewalls have reference numbers 55 and 57.

Figure 7:
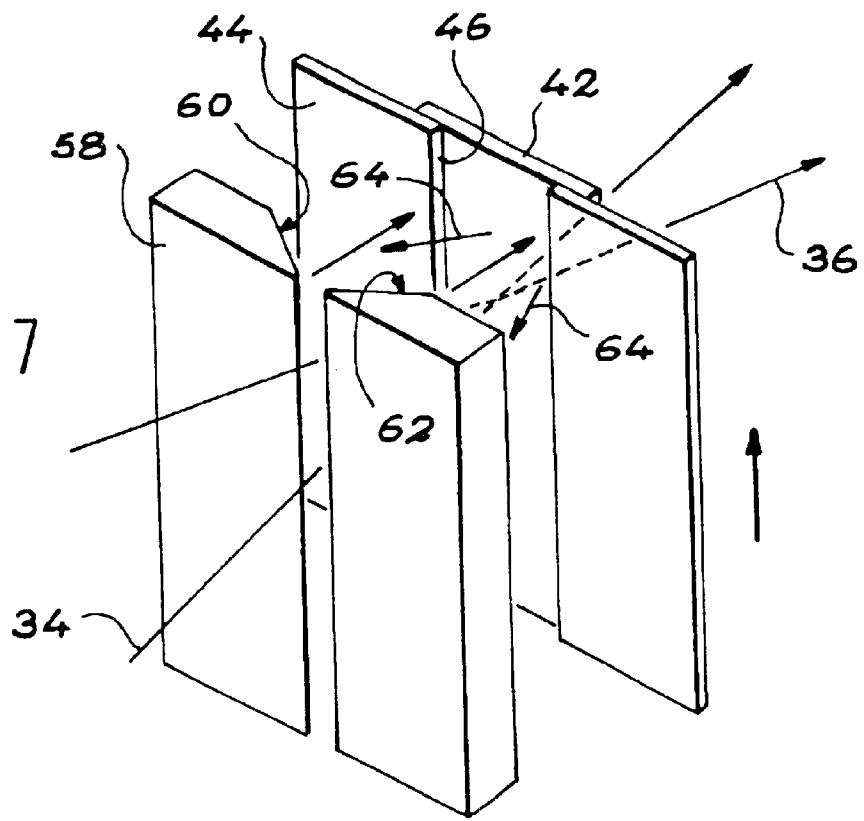
FIG. 7 is a diagrammatic and partial perspective view of another source of EUV radiation that can be used in the invention.

In another example, diagrammatically shown in FIG. 7, the target 42 is fixed to a movable support 44 of the kind described when referring to FIG. 4. Furthermore, in the example in FIG. 7, the source of EUV radiation comprises a component 58, fixed in relation to the focused laser beam 34 and arranged opposite the front face of the target.

This component includes an opening that permits the passage of the laser beam that is focused onto this front face of the target and the opening with which this component is provided, is flared outwards in the direction of the target and therefore comprises two sidewalls 60 and 62 which are inclined with respect to this target and become further apart from one another in the direction of the target.

The radiation 64 emitted through the front face of the target 42 is then absorbed by these sidewalls 60 and 62 and is re-emitted in the direction of the front face of the target.

The EUV radiation 36 emitted through the rear face of the target is therefore more intense.

Of course, a source of X-rays is known from an article by H. Hirose et al., Prog. Crystal Growth and Charact., Vol. 33, 1996, pp. 277–280, that uses an emission of X-rays through the back face of a target formed by a sheet of aluminum with a thickness of 7 μm, the front face of which is irradiated by a laser beam, with a power density of $3 \times 10^{13}$ W/cm$^2$.

However, it should be noted that the source used in the present invention preferably comprises a target of small thickness, this thickness being within the range extending from about 0.05 μm to about 5 μm, this target preferably being made of a material of atomic number Z which is greater than that of aluminum since Z is preferably greater than or equal to 28 (and lower than or equal to 92).

It may be made clear that the preferred material to form the target used in the present invention is tin, the atomic number Z of which has the value 50.

Furthermore, in the invention, one can use a target of very small thickness, less than or equal to 1 μm, formed on a substrate of plastic material (for example a substrate of CH$_2$ (polyethylene) 1 μm thick), the back face of this target (preferably made of tin)—the face which emits the EUV radiation used—rests on this substrate. It is also possible to form, on the front face of this target, a layer of gold the thickness of which is less than 1000 Å (that is to say 100 nm).

Returning to the article mentioned above, it should be noted that the target of aluminum 7 μm thick cannot be considered for an emission through its back face when its front face is irradiated by laser radiation of a maximum power density less than the $3 \times 10^{13}$ W/cm$^2$ mentioned in the article and that, in particular, in the field of microlithography, the maximum power density considered above, is, for example, close to $10^{12}$ W/cm$^2$.

One should also note the following:

When the laser interaction takes place on a material of low atomic number Z, such as aluminum (Z=13), the transport of the laser energy absorbed in the corona (the side where the laser interacts front face) towards the dense and cold zones (that is to say towards the back face) occurs by electronic thermal conduction. Even in the case where the target is relatively thick such as that proposed in the article mentioned above, obtaining anisotropic emission at the back face is not at all guaranteed.

Contrary to this, in the case of a material with a high Z, it is the radiation conduction which "controls" the turn-on of the interior and the rear of the target. The anisotropy which creates the interest in the target used in this invention is directly linked to the emergence of this radiation wave at the back face and therefore to the choice of thickness, an optimized value for which will be given below.

The characteristic temperature and electronic density profiles in the target irradiated by laser are in addition very different depending on whether the material is of low or high atomic number and also depending on the target thickness used.

An analytical model enables one to find the optimum thickness $E_0$ which permits optimization of the rate of conversion X at the back face. $E_0$ is linked to the atomic number Z of the material of the target, to the atomic mass A of this material, to the temperature T (in ° K.) in the medium (itself linked to the laser flux absorbed $\phi_a$ expressed in W/cm$^2$), to the wavelength λ of the laser (in μm), to the pulse duration Dt (in seconds) and to the density ρ (g/cm$^3$), by the following formula:

$$E_0 \text{ (in } cm\text{)} = 26.22(A/Z)^{0.5} \times T^{0.5} \times D_t/\alpha$$

with $\alpha = \rho \times \lambda^2 \times (1 + 0.946(A/Z)^{0.5})$

The temperature (in ° K.) is proportional to $\phi_a^{2/3}$ and to $\lambda^{4/3}$.

For a low available laser energy (lower than 1J), which is generally necessary within the context of lithography, since a very high throughput (greater than 1 kHz) is called for to produce adequate values at the photo-sensitive resin (and thereby guarantee that the exposure threshold is reached) and a given size (for example close to 300 μm diameter) for the emissive zone (imposed by optimum coupling with the optical system used), the laser flux falling on the target is low. In a nanosecond regime, it does not exceed $10^{12}$ W/cm$^2$ at 1.06 μm. Furthermore, at the present time, it is not considered practical to manufacture lasers at these throughputs working with a series of pulses of 100 ps.

Under these conditions, the model above gives a value of 30 eV, as a medium temperature that it is possible to achieve if all the energy is absorbed.

Under these conditions, for aluminum, the optimum thickness which optimizes the rate of conversion X at the back face is 0.15 μm, which is very far from the conditions given in the article mentioned above. Furthermore, with a material such as aluminum, of low atomic number, the radiation emitted through the back face of the target does not, a priori, have any angularity: it is substantially isotropic; the front face and the back face can therefore be considered to be equivalent.

With the example of gold, still under the same conditions, this thickness is less than 0.1 μm.

To return to the example given above of a target made of tin, formed on a substrate made of CH$_2$ (polyethylene), the following details are given: both the polyethylene which can be put on the back face of a thin sheet of tin and the gold which can be put on the front face of this sheet are used to limit the expansion of the emitting material constituted by the tin before it is heated up by the radiation wave, this being in such a way that the photons are driven into the zone of the target which is of interest. The polyethylene at the back face, which is slightly heated, is transparent to the radiation and also limits expansion and therefore to a small extent the emission of material debris.

Figure 8:
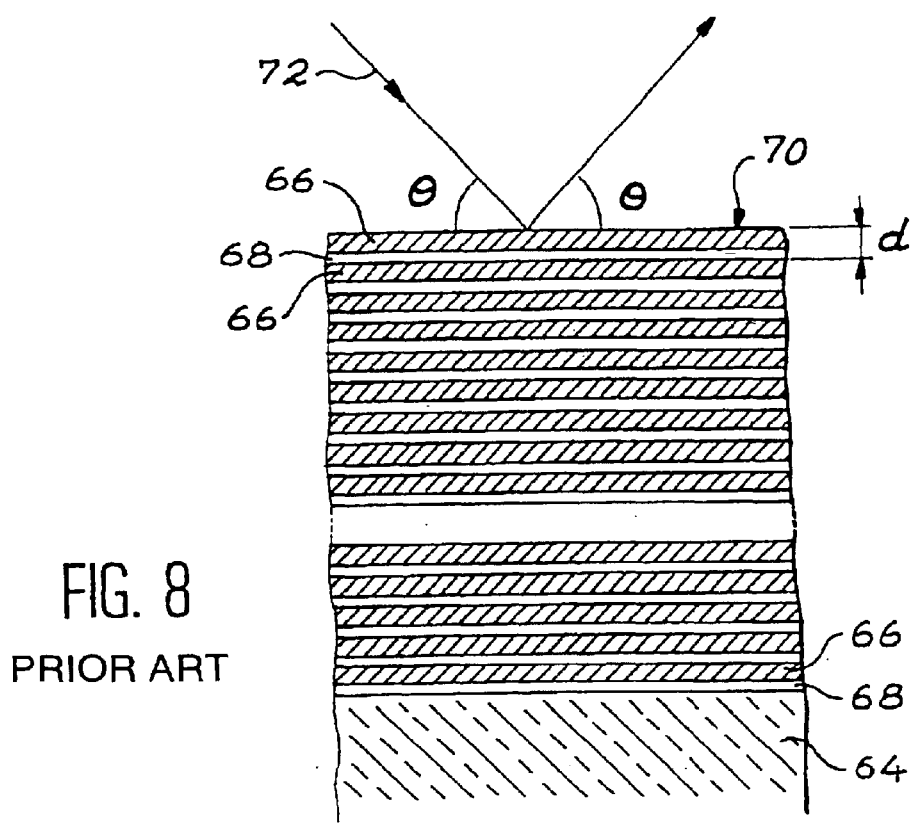
FIG. 8 is a diagrammatic section view of a known multi-layered mirror.

Before describing an example of a multi-layered mirror that may be used in the invention, we shall return to a multi-layered mirror, intended to reflect radiation from the extreme ultraviolet range, making reference to FIG. 8.

This known multi-layered mirror comprises a substrate 64 for example, made of silicon and, on this substrate 64, a stack of layers 66 of a first material and of layers 68 of a second material which alternate with the layers of the first material.

This first material (for example molybdenum) has an atomic number greater than that of the second material (for example, silicon).

The first and second layers work together to reflect the radiation from the extreme ultraviolet domain within a wavelength range centered on a specified wavelength.

The stack has a free surface 70 on which the radiation 72 that one wishes to reflect arrives.

In this known multi-layered mirror, the thickness d of pairs of adjacent layers of the stack is constant. This thickness d is called the inter-reticular distance.

The angle of attack of radiation 72 that one wishes to reflect is designated θ. This angle is the complement of the angle of incidence of this radiation. In addition the wavelength of the reflected radiation is designated λ and k is the order of reflection.

Alternating layers of the first material, or heavy material, and layers of the second material, or light material, induces a periodic variation of the optical index in relation to the thickness. This variation permits selective reflection of the incident radiation.

In effect, if an electromagnetic wave strikes a large number of equidistant reflecting layers, the interferences are everywhere destructive in the direction of the reflected waves except where the path difference is equal to a whole number of wavelengths.

This selective reflection phenomenon can be described by a law analogous to Bragg's Law $$2d \times \sin \theta = k \times \lambda$$

Figure 9:
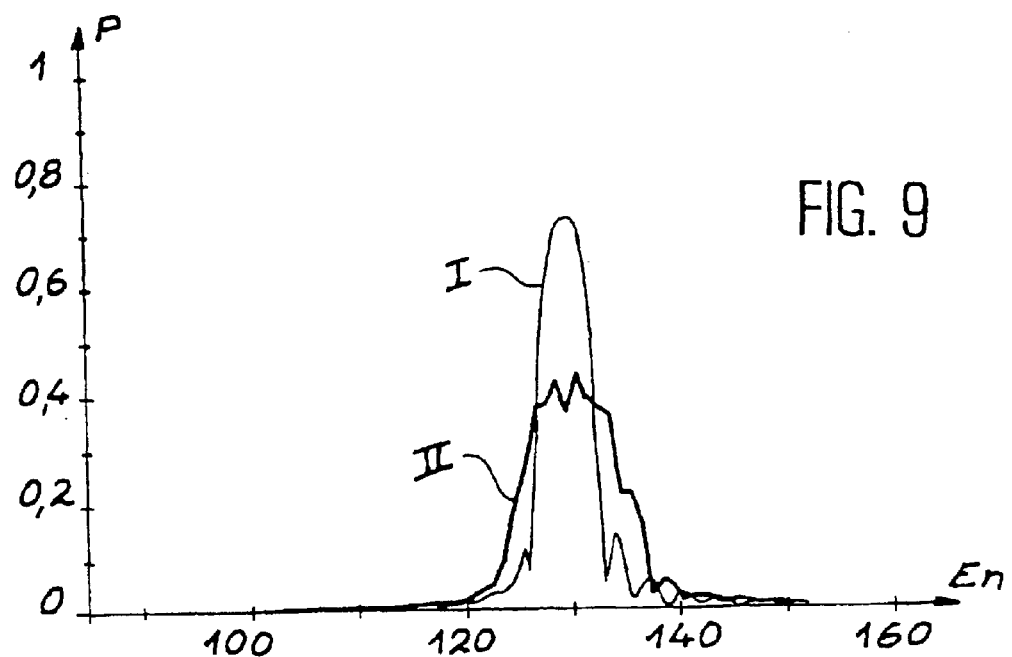
FIG. 9 shows the curve representative of variations in the reflector power as a function of the energy for this known multi-layered mirror (curve I) and for a multi-layered mirror that can be used in the invention (curve II)

In FIG. 9, curve I has been drawn which represents variations in reflector power P (in arbitrary units) of a multi-layered mirror of the kind shown in FIG. 8, as a function of the energy En (in eV) of the incident radiation, for specified values of k and θ. The breadth at mid-height of this curve I is about 6 eV.

The multi-layered mirror in FIG. 8 is therefore a regular structure which has a narrow bandwidth.

In this invention, it is desirable to use multi-layered mirrors with a broad bandwidth so as to collect photon fluxes which are as great as possible.

In order to provide this increase in bandwidth, conforming to the invention, the inter-reticular distance d is gradually modified when the radiation penetrates into the multi-layer.

Therefore, one must choose the nature and the successive thicknesses of the deposited layers in order to adapt the structure of the multi-layered mirror.

Optimization of this multi-layered mirror (with regard to the nature and the thicknesses of the deposited layers) is carried out using a recursive calculation code for transport of the beam of EUV radiation within the stack of layers.

Figure 10:
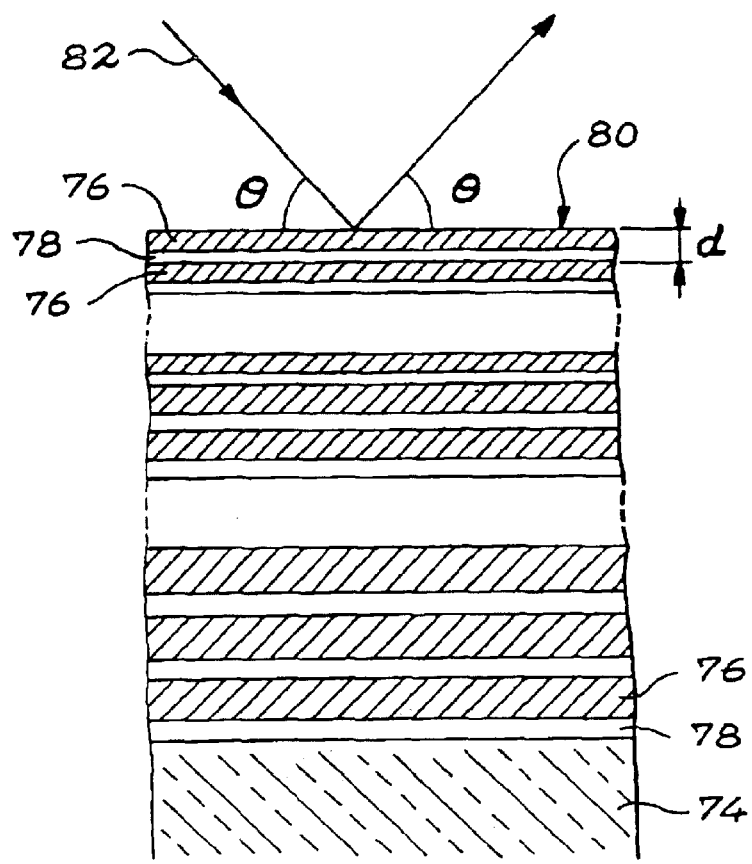
FIG. 10 is a diagrammatic section view of a particular embodiment of a multi-layered mirror that can be used in the invention, FIG. 11 diagrammatically illustrates the general curvature undergone by a multi-layered mirror when subjected to a high thermal flux, FIG. 12 diagrammatically illustrates a localized deformation undergone by a multi-layered mirror when subjected to a high thermal flux.

FIG. 10 is a diagrammatic longitudinal section view of a particular embodiment of multi-layered mirrors that can be used in the invention.

The multi-layered mirror in FIG. 10 comprises a substrate 74 and, on this substrate 74, a stack of layers 76 of a first material and layers 78 of a second material which alternates with the layers of the first material, this first material, or heavy material, having an atomic number greater than that of the second material, or light material.

The first and second layers work together in order to reflect the EUV radiation within a wavelength range centered on a specified wavelength.

The free surface 80 of the stack onto which the EUV radiation 82 to be reflected arrives, may also be seen in FIG. 10.

In contrast to the known multi-layered mirror in FIG. 8, in the multi-layered mirror in FIG. 10, the thickness of the pairs of adjacent layers of the stack is an increasing function of the depth in the stack, this depth being counted from the free surface 80 of the stack.

In the example represented in FIG. 10, the first and second materials are respectively molybdenum and silicon and the substrate 74 is made of silicon. However, beryllium may also be used as the second material and the substrate 74 may be made of germanium.

In the example in FIG. 10, the stack is made up of several groups each comprising a plurality of double layers (a layer of first material and an adjacent layer of second material), for example seven double layers or eight double layers, and the thickness of the groups increases as one passes from the free surface 80 of the stack to the substrate 74. The increases in thickness of the groups form, for example, an arithmetic progression and, within each group, all the layers have substantially the same thickness.

By way of an example, as one passes from the free surface 80 to the substrate 74, there are seven pairs having a total thickness E1, then seven pairs having a total thickness E1+$\Delta$BE, then seven pairs having a total thickness E1+2$\Delta$E, and so on as far as the substrate 74.

In the multi-layered mirror in FIG. 10, the total thickness of the stack of layers is, for example, 1 $\mu$m.

The EUV radiation 82 is reflected on consecutive diopters formed by the heavy material and the light material. If the constructive interference condition between the reflected waves on the various diopters is met (2d$\times$sin $\theta$=k$\times\lambda$), the radiation leaves the multi-layers (Bragg's Law).

The thickness of the substrate 74 depends on the shape and the degree of polishing of this substrate. This thickness of the substrate 74 is between 5 mm and 40 mm.

In order to produce a stack of the kind in FIG. 10, all the layers 78 and 76 are deposited successively, with the desired thicknesses, on the substrate 74, for example using cathodic sputtering.

Of course, the use of multi-layers having a configuration comparable to that in FIG. 10 is known, but for a totally different range of wavelengths and for a totally different function: these known multi-layered stacks are used as band-pass filters for radiation in the visible range.

It should be noted that, in the EUV range, the design of multi-layered mirrors that can be used in the invention is specific, in particular with regard to the nature, the thicknesses, the densities, the optical constants of the materials and the quality of the deposits.

In the lithography device in FIG. 3, the multi-layered mirrors that form the collector 26, the mask 24 and the optical projection and reduction means 29 are multi-layered mirrors of the kind in FIG. 10 and are capable of reflecting the EUV radiation, the wavelengths of which are centered on a specified wavelength (for example 12 nm).

In particular, the collector 26 can be formed by the joining of several elementary collectors which constitute multi-layered mirrors of the kind in FIG. 10.

FIG. 9 shows the curve II that represents variations in the reflector power P (in arbitrary units) as a function of the energy En (in eV), for a multi-layered mirror that can be used in the invention, for example of the kind in FIG. 10.

The large increase in the mid-height width, which is 9 eV for the curve II, in comparison with a multi-layered mirror of the prior art (curve I) can be seen.

Therefore, in the invention, the band width of the multi-layered mirrors for EUV radiation is increased.

An explanation will now be given of a way of minimizing the thermal deformation undergone by any multi-layered mirror and, in particular a multi-layered mirror that can be used in the invention when this multi-layered mirror is exposed to intense EUV radiation.

In order to obtain such a mirror, about a hundred pairs of layers of suitable thickness (layers of heavy material alternating with layers of light material) are deposited for example, on a silicon substrate, optically polished to the desired shape, so as to obtain a total thickness of layers of the order of 1 $\mu$m. This thickness is therefore negligible in comparison with that of the substrate (for example, a few millimeters) which provides the shape of the multi-layered mirror.

The deformation of a flat mirror subjected to a thermal flux density on its front face is of a geometric nature. This deformation has two components.

The first component is parallel to the surface of the plate forming the mirror. This first component leads to general spherical curvature through a bilaminar effect and results from the temperature difference between the front face and the back face of the mirror.

The second component is perpendicular to the surface of the mirror and causes local deformation, namely a local increase in the thickness of the mirror. It is due to the lack of homogeneity of the density of the thermal flux to which the mirror is subject.

Figure 11:
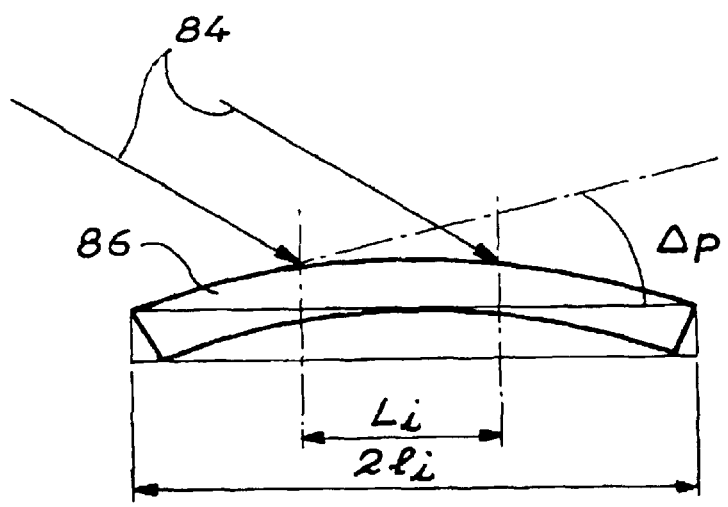

The general curvature (bilaminar effect) is diagrammatically illustrated in FIG. 11. The incident radiation 84 on the multi-layered mirror can be seen.

The temperature difference $\Delta T_s$ between the front face and the back face of the mirror causes general spherical curvature with an associated maximum slope $\Delta p$.

For a non-cooled mirror, the edges of which are free, this slope is expressed by the following equation in which $\phi$ is the thermal flux density (in W/mm$^2$), $\alpha$ the thermal coefficient of expansion of the mirror, k the thermal conductivity of the mirror, C a constant of value 1 for a spherical curvature and ½ in the case of a cylindrical curvature and $l_i$, half of the length of the mirror:

$$\Delta p = C \times (\alpha/k) \times \phi \times l_i$$

This slope associated with the general curvature varies with the incident flux in a linear fashion. It becomes greater as the ratio $\alpha$/k becomes greater and when the dimensions of the beam on the mirror are large.

The slope $\Delta p$ is independent of the thickness of the mirror and of the angle of attack of the radiation on this mirror. The radius of curvature associated with the deformation of the mirror does not depend on the dimensions of this mirror. This radius of curvature R is expressed by the equation:

$$R = \phi^{-1} \times (k/\alpha).$$

Figure 12:
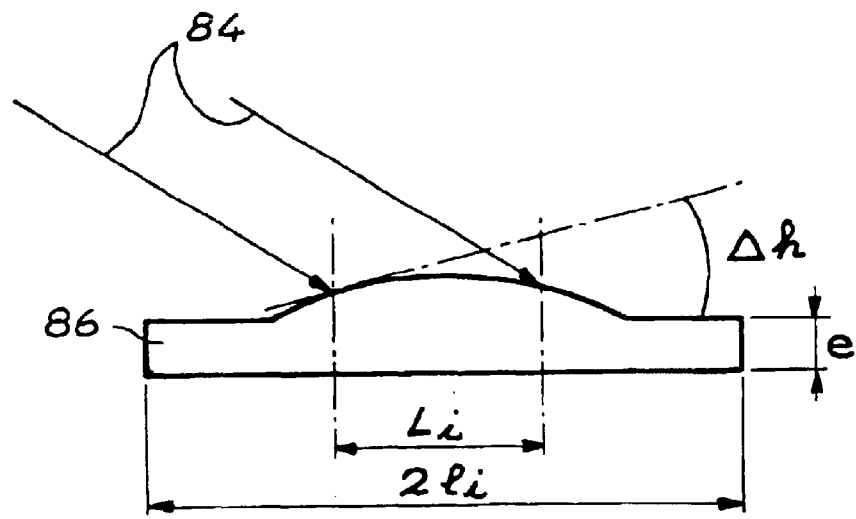

Th localized deformation which is diagrammatically illustrated in FIG. 12 will now be considered. This local deformation is due to the expansion of the mirror perpendicular to its surface. It is due to the lack of homogeneity of the flux incident to the mirror. This lack of homogeneity is induced by the angular divergence of the beam 84 which may, for example, follow a Gaussian distribution law.

The maximum slope Δh associated with this localized deformation is expressed by the following equation:

$$\Delta h = 2 \times (\alpha/k) \times (e^2 / L_i) \times \phi_0.$$

In this equation, $\phi_0$ is the flux density at the center of the print of the beam on the multi-layered mirror, e the thickness of this mirror, $\alpha$ the coefficient of thermal expansion, k the thermal conductivity of the mirror and $L_i$ the width, at mid-height, of the print of the beam on the mirror.

The slope Δh varies in a linear way with the incident flux. It becomes greater as the ratio α/k becomes greater and as when the impact of the beam on the mirror is small. This slope varies with the square of the thickness of the mirror.

In order to reduce the effects of these mechanical deformations, it is necessary that the print of the beam on the multi-layered mirror should have large dimensions, in order to "spread" the thermal flux density, and requires a mirror of small thickness, that is not very absorbent with respect to the radiation and which has a low α/k ratio.

The print of the beam on the multi-layered mirror depends on the angle of attack chosen for the reflection. This angle of attack is close to 90°, which minimizes the print of the beam.

The choices of the kind of mirror and its thickness depend on the polishing techniques that permit one to obtain the desired shape and surface roughness.

Figure 13:
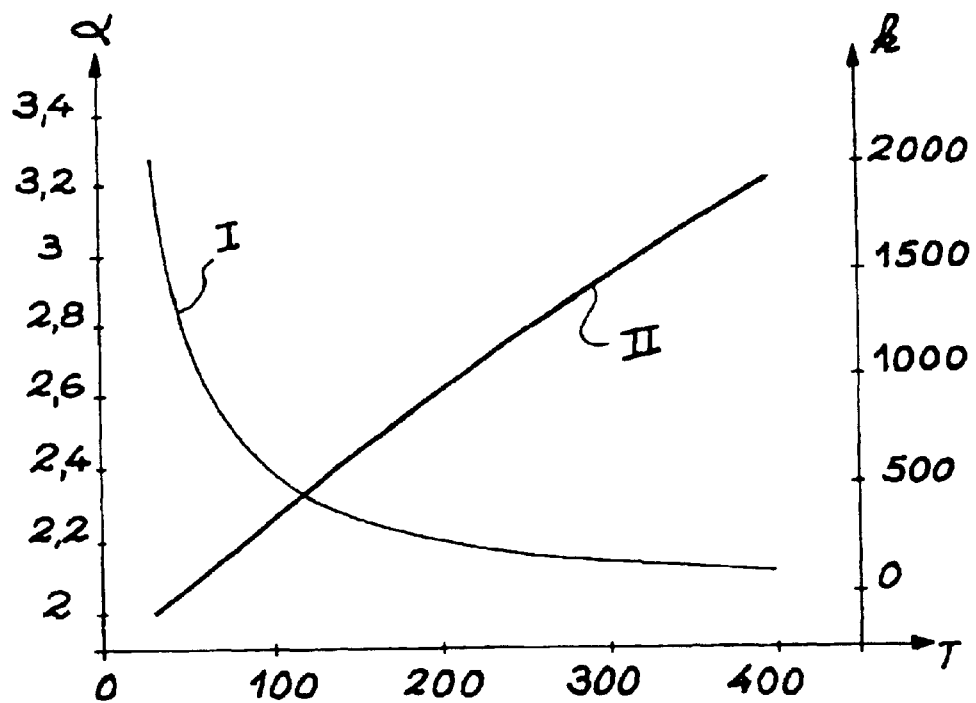
FIG. 13 shows the curve representing variations in the thermal conductivity k (curve I) and the coefficient of thermal expansion α (curve II), for silicon, as a function of temperature.

The thermal conductivity k and the coefficient of thermal expansion α vary as a function of temperature. As shown in FIG. 13, in the case of silicon, one can benefit from the very low coefficient of expansion α of this material, associated with high thermal conductivity k when the temperature is close to 125 K.

In FIG. 13, one can see curve II which represents variations in the coefficient of thermal expansion α of silicon (in $10^{-6}$ $K^{-1}$) as a function of the temperature T (in K) and curve I which represents variations in the thermal conductivity k (in W/m.K) as a function of the temperature T (in K).

Figure 14:
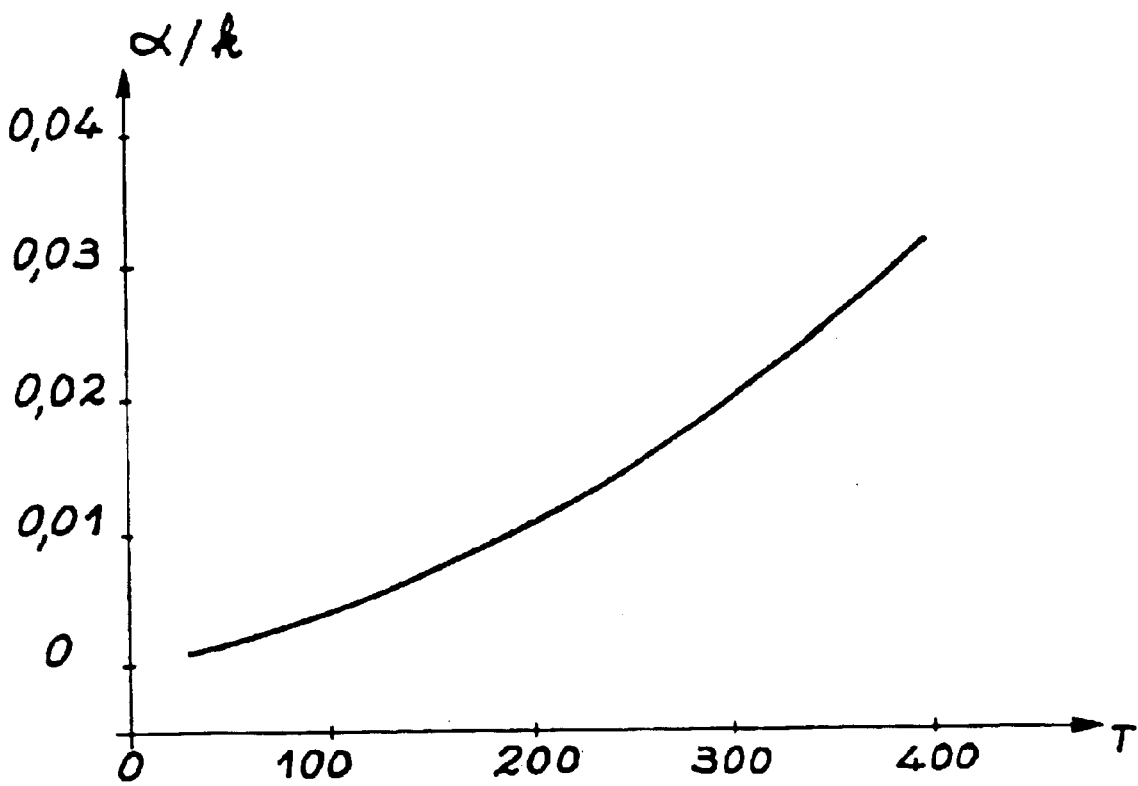
FIG. 14 shows the curve representing variations in the ratio α/k as a function of temperature.

In this case, the ratio α/k tends towards 0 when the temperature tends towards zero, which minimizes the mechanical deformations due to the thermal flux. One is referred to FIG. 14 which shows the curve which represents variations in α/k (in $10^{-6}$ m/W) as a function of the temperature (in K).

Preferably, in the invention therefore, the multi-layered mirrors for example of the kind in FIG. 10 are cooled to a low temperature close to 100 K, in order to minimize the mechanical deformation due to the thermal flux during use of the EUV lithography device, whatever the material of the substrate of the mirror (silicon or germanium for example).

Figure 15:
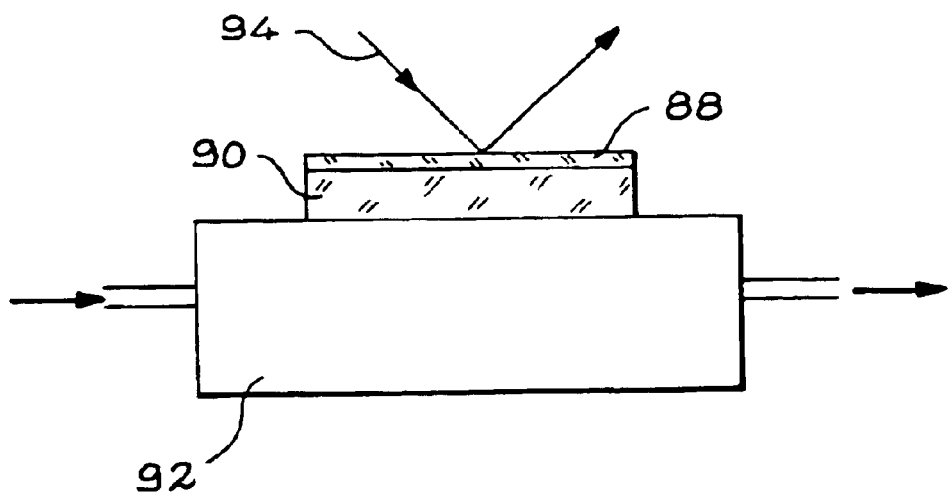
FIG. 15 is a diagrammatic view of means of cooling a multi-layered mirror, which can be used in the invention.

FIG. 15 diagrammatically illustrates this. A multi-layered mirror can be seen, which comprises a stack 88 of alternating layers on a substrate 90 and which is cooled. In order to do this, the mirror is placed on a support 92 within which liquid nitrogen is circulated. As a variant, this support 92 contains a reservoir of liquid nitrogen.

In this way, deformation of the multi-layered mirror is reduced when it receives a high EUV radiation flux 94.

Returning to FIG. 10. In the example in this FIG. 10, the thickness of the pairs of adjacent layers of the stack of the multi-layered mirror is a function that increases with the depth in the stack. Nevertheless a multi-layered mirror that can be used in the invention is obtained in which the thickness of the pairs of adjacent layers is a function which decreases with the depth in this stack.

What is claimed is:

1. A lithography device comprising:
   a support (16) for a sample intended to be exposed in accordance with a specified pattern,
   a mask (24) comprising the specified pattern in an enlarged form,
   a source (22) of radiation in the extreme ultraviolet range,
   optical means (26) for collection and for transmission of the radiation to the mask, the latter supplying an image of the pattern in enlarged form, and
   optical means (29) for reduction of this image and for the projection of the reduced image onto the sample,
   the mask, the optical means for the collection and the transmission and the optical means for reduction and projection comprising multi-layered mirrors, each multi-layered mirror comprising a substrate (74) and, on this substrate, a stack of layers (76) of a first material and of layers (78) of a second material which alternate with the layers of the first material, this first material having an atomic number greater than that of the second material, the first and second layers co-operating to reflect the extreme ultraviolet radiation, the stack having a free surface (80) onto which the radiation to be reflected arrives,
   this device being characterized in that the source comprises at least one solid target (28), having first and second faces, this target being capable of emitting the extreme ultraviolet radiation by interAction with a laser bean (34) focused on the first face (30) of the target, this target being capable of emitting, in an anisotropic way, a part (36) of the extreme ultraviolet radiation from the second face (37) of this target, in that the optical means (26) for collection and for transmission are provided in order to transmit, to the mask (24), the part (36) of the extreme ultraviolet radiation coming from the second face (37) of the target of the source and in that the thickness of pairs of adjacent layers (76, 78), in the stack of layers that each mirror comprises, is a monotonic function of the depth in the stack, this depth being counted from the free surface (80) of the stack.

2. Device according to claim 1, in which the target (28) contains a material which is capable of emitting the extreme ultraviolet radiation by interAction with the laser beam and the thickness of the target is within a range extending from about 0.05 μm to about 5 μm.

3. Device according to claim 1, in which the target (28) contains a material which is capable of emitting the extreme ultraviolet radiation through interAction with the laser beam and which has an atomic number belonging to the group of atomic numbers ranging from 28 to 92.

4. Device according to claim 1, comprising a plurality of targets (42) which are made integral one with another, the device additionally comprising means (48, 50) of displacing this plurality of targets so that these targets successively receive the laser beam (34).

5. Device according to claim 4, additionally comprising support means (38, 44, 52) to which the targets (42) are fixed and which are capable of allowing the laser beam to pass in the direction of these targets, the means of displacement (48, 50) being provided in order to displace these means of support and hence the targets.

6. Device according to claim 5, in which the means of support (52) are capable of absorbing radiation emitted by the first face of each target which receives the laser beam and of re-emitting this radiation towards this target.

7. Device according to claim 5, in which the means of support comprise an opening (40, 46) facing each target, this opening being defined by two sidewalls (54, 56), substantially parallel to one another and perpendicular to this target.

8. Device according to claim 5, in which the means of support comprise an opening facing each target, this opening being defined by two sidewalls (55, 57) which become further apart from one another as they go towards the target.

9. Device according to claim 1, additionally comprising auxiliary fixed means (58) which are capable of allowing the laser beam (34) to pass in the direction of the target, of absorbing the radiation emitted by the first face of this target and of re-emitting this radiation towards this target.

10. Device according to claim 1, in which the stack is subdivided into assemblies of at least one pair of first and second layers (76, 78) and the thickness of these assemblies is a monotonic function of the depth in the stack, this depth being counted from the free surface (80) of the stack.

11. Device according to claim 10, in which the increases in thickness of these assemblies form an arithmetic progression.

12. Device according to claim 10, in which the first and second layers (76, 78) of each assembly have approximately the seine thickness.

13. Device according to claim 1, in which the first and second materials are respectively molybdenum and beryllium or molybdenum and silicon.

14. Device according to claim 1, in which the substrate (74) is made of a material which is chosen from among silicon and germanium.

15. Device according to claim 1, in which the thickness of the substrate (74) is within the range extending from about 5 mm to about 40 mm and the thickness of the stack is about 1 $\mu$m.

16. Device according to claim 1, in which each multi-layered mirror is fitted with means (92) of cooling this multi-layered mirror to reduce deformation of it when it is illuminated by the extreme ultraviolet radiation.

17. Device according to claim 16, in which the cooling means (92) are provided in order to cool the multi-layered mirror to a temperature roughly equal to 100 K.

18. Device according to claim 16, in which the means (92) of cooling the mirror are means of cooling by liquid helium, Freon, liquid nitrogen or a cooling fluid which is a heat transfer fluid at a low temperature close to 0 K.

19. Device according to claim 1, wherein the sample comprises a semi-conductor substrate (18) on which a layer (20) of photo-sensitive resin is deposited and which is intended to be exposed in accordance with the specified pattern.

* * * * *

UNITED STATES PATENT AND TRADEMARK OFFICE
CERTIFICATE OF CORRECTION

PATENT NO. : 6,724,465 B2
DATED : April 20, 2004
INVENTOR(S) : Danièle Babonneau et al.

It is certified that error appears in the above-identified patent and that said Letters Patent is hereby corrected as shown below:

Column 11,
Line 35, please delete "E1+$\Delta$BE", and insert therefor -- E1+$\Delta$E --.

Column 13,
Line 11, please delete "$L_l$", and insert therefor -- $L_i$ --.

Column 15,
Line 22, please delete "seine", and insert therefor -- same --.

Signed and Sealed this

Twenty-third Day of November, 2004

JON W. DUDAS
*Director of the United States Patent and Trademark Office*